US006673514B2

(12) United States Patent
Kitson et al.

(10) Patent No.: US 6,673,514 B2
(45) Date of Patent: Jan. 6, 2004

(54) IMAGABLE ARTICLES AND COMPOSITIONS, AND THEIR USE

(75) Inventors: Anthony Paul Kitson, West Yorkshire (GB); Diane Cook, Huddersfield (GB); Kevin Barry Ray, Ft. Collins, CO (US); Colin Adrian Wright, Fort Collins, CO (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/948,182

(22) Filed: Sep. 7, 2001

(65) Prior Publication Data

US 2003/0077538 A1 Apr. 24, 2003

(51) Int. Cl.$^7$ .............................. G03C 1/76; G03F 7/09

(52) U.S. Cl. .................... 430/270.1; 430/320; 430/313; 430/287.1; 430/281.1; 430/302; 430/5

(58) Field of Search .............................. 430/270.1, 320, 430/313, 287.1, 302, 5, 944, 945, 9, 348

(56) References Cited

U.S. PATENT DOCUMENTS

| | | | | | |
|---|---|---|---|---|---|
| 4,247,624 | A | * | 1/1981 | Foss | 430/281.1 |
| 4,491,628 | A | | 1/1985 | Ito et al. | 430/176 |
| 4,883,740 | A | | 11/1989 | Schwalm et al. | 430/270 |
| 5,066,566 | A | | 11/1991 | Novembre | 430/296 |
| 5,073,474 | A | | 12/1991 | Schwalm et al. | 430/270 |
| 5,075,199 | A | | 12/1991 | Schwalm et al. | 430/281 |
| 5,102,771 | A | | 4/1992 | Vogel et al. | 430/270 |
| 5,350,660 | A | | 9/1994 | Urano et al. | 430/176 |
| 5,759,750 | A | | 6/1998 | Binder et al. | 430/326 |
| 5,827,634 | A | | 10/1998 | Thackeray et al. | 430/270.1 |
| 5,882,835 | A | | 3/1999 | Park et al. | 430/170 |
| 5,994,023 | A | | 11/1999 | Van Damme et al. | 430/176 |
| 6,033,827 | A | | 3/2000 | Itani | 430/270.1 |
| 6,143,471 | A | * | 11/2000 | Takata et al. | 430/281.1 |
| 6,255,033 | B1 | * | 7/2001 | Levanon et al. | 430/275.1 |
| 6,365,323 | B1 | * | 4/2002 | Narang et al. | 430/280.1 |
| 6,391,524 | B2 | * | 5/2002 | Yates et al. | 430/286.1 |
| 6,410,203 | B1 | * | 6/2002 | Nakamura | 430/270.1 |
| 6,423,456 | B1 | * | 7/2002 | Kitson et al. | 430/17 |
| 6,451,502 | B1 | * | 9/2002 | Ray et al. | 430/270.1 |
| 2002/0009671 | A1 | * | 1/2002 | Gries et al. | 430/273.1 |

OTHER PUBLICATIONS

Patent Abstract of Japanese Pub. No. 1005 for Japanese Pat. Appln. No. 08211082 (2/98).

O'Brien et al., "Mid–UV photoresists combining chemical amplification and dissolution inhibition", SPIE vol. 920, pp. 42–50, Advances in Resist Technology and Processing V (1988).

McKean et al., "Novolac based deep–UV resists", SPIE vol. 920, pp. 60–63, Advances in Resist Technology and Processing V (1988).

Kihara et al., "Effect of Substituent Groups of Phenol Derivative Dissolution Inhibition Efficiency", SPIE vol. 2724, pp. 208–215, (1996).

* cited by examiner

*Primary Examiner*—Janet Baxter
*Assistant Examiner*—Yvette C. Thornton
(74) *Attorney, Agent, or Firm*—Faegre & Benson LLP

(57) ABSTRACT

A thermally imagable article comprises a substrate on which is coated a positive working heat-sensitive composition comprising a hydroxyl group-containing polymer and a heat-labile moiety which decreases the developer solubility of the composition as compared to the developer solubility of the composition without the heat-labile moiety, wherein the heat-sensitive composition does not comprise an acid generating moiety. The invention also provides novel positive working compositions comprising heat-labile moieties, and imagable articles comprising said compositions.

23 Claims, 2 Drawing Sheets

IMAGABLE ARTICLES AND COMPOSITIONS, AND THEIR USE

BACKGROUND OF INVENTION

1. Technical Field of the Invention

The present invention relates to imagable articles, and coating compositions therefor. In particular the present invention relates to imagable articles, and coating compositions comprising positive working, heat sensitive materials including heat-labile moieties. The invention also extends to methods of manufacturing imagable articles.

2. Background to the Invention

Imagable articles, such as lithographic printing form precursors, electronic part precursors and mask precursors conventionally comprise a substrate onto which is coated a film-forming, radiation sensitive composition. After image-wise exposure of the precursor to radiation of suitable wavelength, and development of the imaged precursor, an imaged article is produced.

Positive working imagable articles have a radiation sensitive coating, which, when image-wise exposed to radiation of a sensitive wavelength, becomes more soluble in a developer liquid in the exposed areas, than in areas not exposed. On development, the exposed areas of the coated composition are removed, leaving an image formed from the remaining areas.

The coatings are normally laid down as solutions in organic solvents, which are removed by evaporation. Conventionally, ultra-violet or visible radiation has been employed to image compositions sensitive to radiation of those wavelengths. Recently infra-red (IR) radiation has become of interest.

In many systems the compositions contain IR absorbers which convert IR radiation to heat, and it is the heat which is the direct cause of the increase in the solubility of the compositions. A heated body delivering heat conductively to corresponding compositions not containing IR absorbers can likewise effect a solubility change. A suitable IR radiation source is an IR laser digitally controlled to produce the required pattern of heated areas. Thus, these compositions are suitable for advanced "Computer-to-Plate" (CTP) techniques. Some compositions, which are not additionally sensitive to ultra-violet or visible radiation offer the advantage, over traditional photosensitive recording compositions, that they do not need to be handled in a dark room, or under ultra-violet safelighting conditions, but can simply be handled in ordinary light.

There are many examples of positive working compositions which are sensitive to UV or visible radiation, and which are used in coatings on imagable articles. Many such positive working compositions utilize polymers in conjunction with acid-cleavable moieties and acid generating compounds. In these systems the composition is exposed to UV or visible radiation which causes generation of and acid, which acid then effects cleavage of the acid-cleavable group to render the exposed polymer more soluble in a developer than the unexposed polymer.

Examples of UV-sensitive systems employing resist materials comprising a polymeric binder having an acid-cleavable group and an acid generating moiety include those described in U.S. Pat. Nos. 5,073,474, U.S. 5,882,835, U.S. 5,066,566, U.S. 4,491,628, U.S. 4,883,740, U.S. 6,033,827, U.S. 5,827,634, U.S. 5,759,750, U.S. 5,350,660, U.S. 5,075,199, JP10055067, U.S. Pat. Nos. 5,994,023, and 5,102,771.

Examples of UV-sensitive systems employing polymeric binders having acid cleavable groups, and acid generating compounds also include the systems disclosed in SPIE Vol. 920, "Advances in Resist Technology and Processing V", 1988, pages 60–63, and pages 42–50.

In many cases the acid generators used are relatively expensive and may be unstable with regards to premature acid generation.

Initial studies have been undertaken to assess the effect of heat on deprotection of tert-butoxycarbonyl (t-BOC) protected polymeric binder compositions, such as in "Photoreactive Polymers" (A. Reiser) [1998] pages 279–283. The thermodynamic behaviour of dissolution of polymeric binders including t-BOC based inhibitor compounds has also been investigated, as in "Effect of Substitutent Groups of Phenol Derivative Dissolution Inhibitors on Inhibition Efficiency", SPIE Vol. 2724 (1996).

It is an aim of preferred embodiments of the present invention to overcome or mitigate at least some of the problems associated with the prior art discussed above or other problems whether expressly disclosed hereinabove or not.

It is a further aim of preferred embodiments of the present invention to provide an effective thermal imaging technology.

Applicant has surprisingly found that in imagable articles and compositions, certain heat-labile moieties can be used to protect hydroxyl group-containing polymers, wherein upon exposure to heat the heat-labile moiety is removed or a complex formed by the heat-labile moiety and polymer is broken, whereupon the composition including the hydroxyl group-containing polymer exhibits increased developer solubility. Using such systems negates the need for acid generating systems or exposure to UV or visible radiation. Thus the systems of the present invention may be relatively inexpensive, and have improved handling characteristics in ambient light. Furthermore, the developer solubility differential between exposed and non-exposed compositions is good.

Applicant has further found that the use of a radiation absorbing compound, capable of absorbing radiation and converting it to heat, in the imagable and imaged articles and compositions of the present invention, serves to further increase their beneficial characteristics.

SUMMARY OF THE INVENTION

According to a first aspect of the present invention there is provided a thermally imagable article comprising a substrate on which is coated a positive working heat-sensitive composition comprising a hydroxyl group-containing polymer and a heat-labile moiety which decreases the developer solubility of the composition as compared to the developer solubility of the composition without the heat-labile moiety, wherein the heat-sensitive composition does not comprise an acid generating moiety.

By acid generating moiety we mean a moiety capable of generating an acid on exposure of the imagable article to heat and/or radiation.

By heat-labile moiety we mean a moiety which is capable of undergoing separation from and/or deprotecting a parent material when exposed to heat. Deprotection according to this invention includes chemically cleaving or splitting the heat-labile moiety, or removing the heat-labile moiety from the parent material.

It is believed that exposure of the imagable article to heat causes removal or splitting of the heat-labile moiety or deprotection of the polyhydroxyl group-containing polymer, which causes an increase in the developer solubility of the composition.

DETAILED DESCRIPTION OF THE INVENTION

Figure 1:
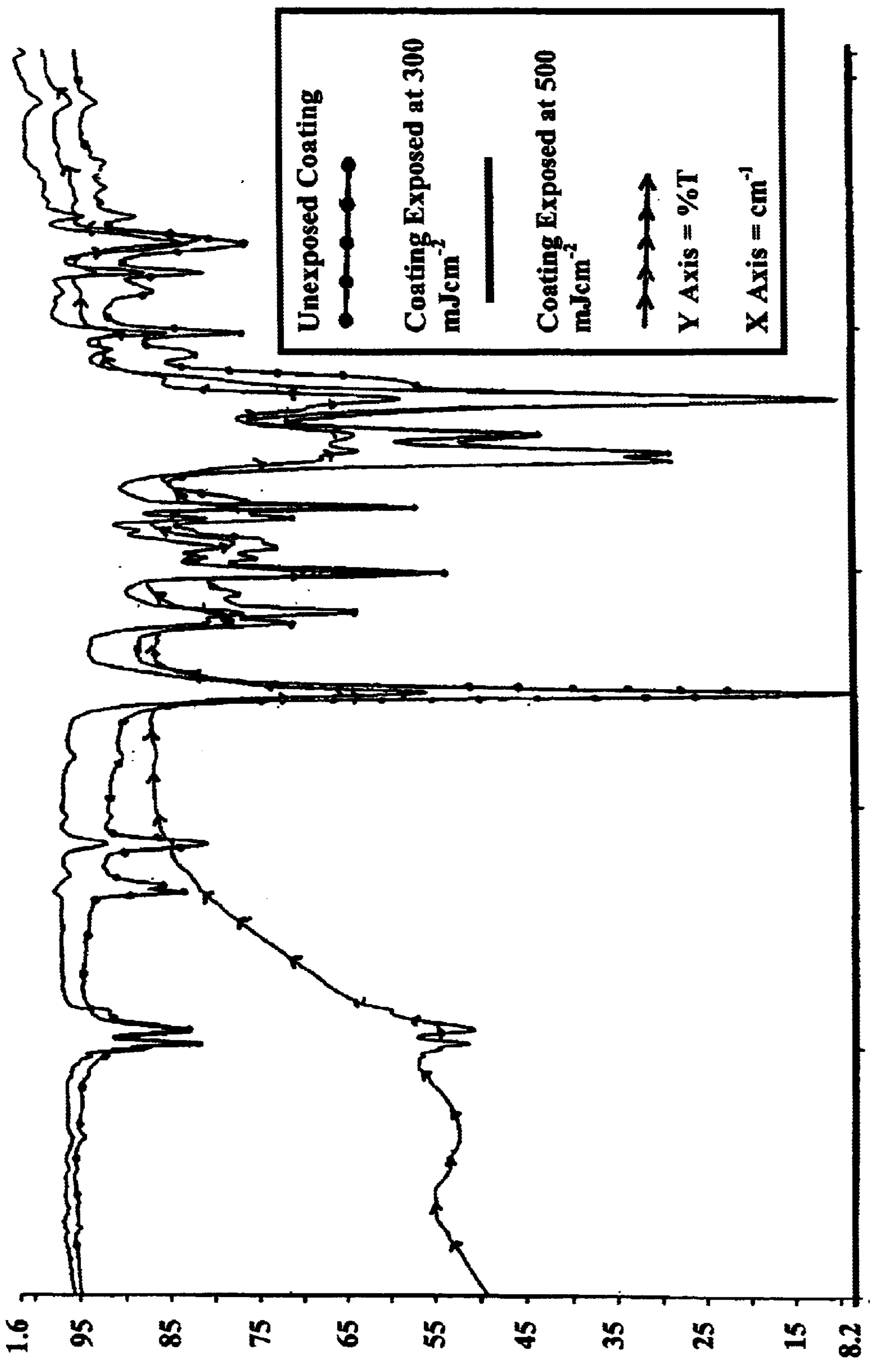
FIG. 1 illustrates the FTIR spectra obtained from the coating of Example 19.

Preferably the heat-labile moiety is a moiety having the formula

Formula (I)

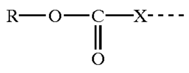

wherein R is an alkyl group, an arylalkyl group, an aryl group, an alkenyl group or a silyl group and X is an alkoxy group, an oxyaryl group, an imino group, an aryl group, an arylalkyl group, oxygen or a carbonate group.

The dotted bond extending from X represents a bond for attachment of the heat-labile moiety to a parent compound or polymer where applicable or desired, but the heat-labile moiety may be a free-standing compound per se.

In general terms, any alkyl group is suitably a $C_{1-12}$ alkyl group, preferably $C_{1-6}$ alkyl group, especially a $C_{1-4}$ alkyl group. An alkyl group may be branched (for example t-butyl) or straight chain (for example n-butyl), but is preferably branched.

Preferably R is selected from the group consisting of $—C(CH_3)_3$, 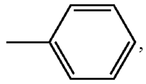, 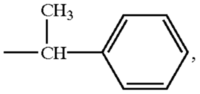,

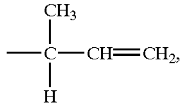 and $—Si(CH_3)_3$

More preferably R is $C(CH_3)_3$.

Preferably —X - - - is selected from the group consisting of

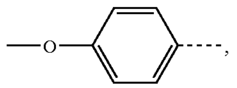, 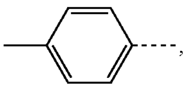,

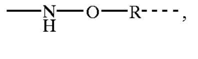, 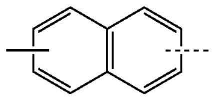

-continued

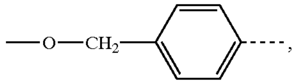, —O—alkyl-----, and

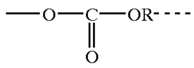

wherein R is as defined above.

There may be a plurality of heat-labile moieties, independently selected from moieties having formula (I).

Suitably the heat-labile moiety is a pendent group on the hydroxyl group-containing polymer.

There may be more than one hydroxyl group-containing polymer present and each hydroxyl group-containing polymer may comprise a heat-labile moiety. Each heat-labile moiety on each hydroxyl group-containing polymer may be independently selected from the heat-labile moiety of formula (I).

Suitably the pendent heat-labile moieties are attached to the hydroxyl group-containing polymer via the hydroxyl groups. Preferably not all of the hydroxyl groups are functionalised with the heat-labile moiety, and thus the polymer preferably comprises both pendent heat-labile moieties and free hydroxyl groups.

When the heat-labile moiety is a pendent group on the hydroxyl group-containing polymer, preferably —X - - - is

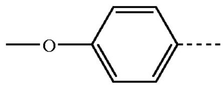

The heat-labile moiety may form part of the backbone of the hydroxyl group-containing polymer.

Alternatively, the composition may contain a hydroxyl group-containing polymer and a separate polymer not containing hydroxyl groups, and the heat-labile moiety may form part of the backbone of the polymer not containing hydroxyl groups.

When the heat-labile moiety forms part of the backbone of the hydroxyl group-containing polymer, suitably —X - - - is

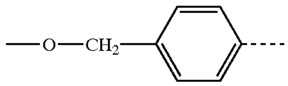

When the heat-labile moiety forms part of the backbone of the hydroxyl group-containing polymer preferably the hydroxyl group-containing polymer has the formula

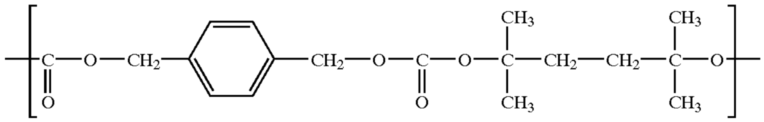

Alternatively the heat-labile moiety may form part of a separate compound arranged to be admixed with the hydroxyl group-containing polymer. Suitable compounds comprising heat-labile moieties of formula (I) include

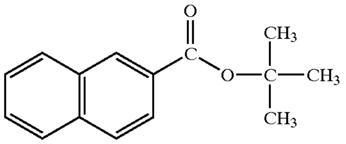

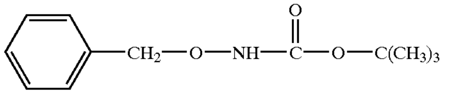

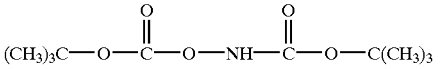

and

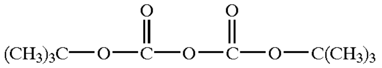

The hydroxyl group-containing polymer is preferably a phenolic resin or co-polymer thereof. Other polymers suitable as hydroxyl group-containing polymers include poly-4-hydroxystyrene; copolymers of 4-hydroxystrene, for example with 3-methyl-4-hydroxystrene or 4-methoxystrene; copolymers of (meth)acrylic acid, for example with styrene; copolymers of maleiimide, for example with styrene; hydroxy or carboxy functionalised celluloses; dialkylmaleiimide esters; copolymers of maleic anhydride, for example with styrene; and partially hydrolysed polymers of maleic anhydride.

Particularly useful phenolic resins in this invention are the condensation products from the interaction between phenol, C-alkyl substituted phenols (such as cresols and p-tert-butyl-phenol), diphenols (such as bisphenol-A) and aldehydes and ketones (such as formaldehyde and acetone). Depending on the preparation route for the condensation a range of phenolic materials with varying structures and properties can be formed, as will be well understood to those skilled in the art. One useful class is pyrogallol/acetone condensates. Particularly useful in this invention are novolac resins, resole resins and novolac/resole resin mixtures. Most preferred are novolac resins. Examples of suitable novolac resins have the following general structure:

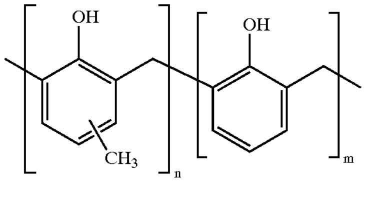

where the ration n:m is in the range of 1:20 to 20:1, preferably 3:1 to 1:3. In one preferred embodiment n=m. However, in certain embodiments n or m may be zero. Novolac resins suitable for use have a molecular weight in the range of about 500–20,000, preferably in the range of about 1000–15,000, more preferably about 2500–10,000.

Novolac resins useful in this invention are suitably condensation reaction products between appropriate phenols, for example phenol itself, C-alkyl substituted phenols (including cresols, xylenols, p-tert-butyl-phenol, p-phenylphenol and nonyl phenols), diphenols (e.g. bisphenol-A (2,2-bis(4-hydroxyphenyl)propane)), and appropriate aldehydes, for example formaldehyde, chloral, acetaldehyde and furfuraldehyde. As will be well understood by those skilled in the art, the type of catalyst and the molar ratio of the reactants used in the preparation of phenolic resins determines their molecular structure and therefore the physical properties of the resin. An aldehyde:phenol ratio between 0.5:1 and 1:1, preferably 0.5:1 to 0.8:1 and an acid catalyst is typically used to prepare novolac resins, which are thermoplastic in character. Higher aldehyde:phenol ratios of more than 1:1 to 3:1, and a basic catalyst, give rise to resole resins, and these are characterised by their ability to be thermally hardened at elevated temperatures.

The hydroxyl group-containing polymer may comprise a polyhydroxystyrene resin or co-polymer thereof, of general formula:

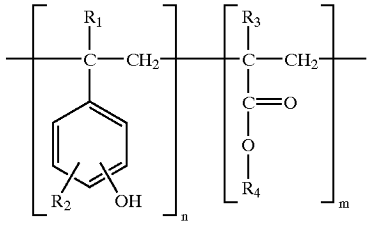

wherein $R_1$ represents a hydrogen atom or alkyl group, $R_2$ represents a hydrogen atom or alkyl group, $R_3$ represents a hydrogen atom or alkyl group, $R_4$ is an alkyl or hydroxyalkyl group, and the ratio n/m is in the range 10/0 to 1/10.

In general terms, any alkyl group is suitably a $C_{1-12}$ alkyl group, preferably a $C_{1-16}$ alkyl group, especially a $C_{1-14}$ alkyl group. An alkyl group may be branched (for example t-butyl) or straight chain (for example n-butyl).

$R_1$ preferably represents a hydrogen atom or a $C_{1-14}$ alkyl group, especially a methyl group. Most preferably $R_1$ represents a hydrogen atom.

R2 preferably represents a hydrogen atom or a $C_{1-14}$ alkyl group, especially a methyl group. Most preferably $R_2$ represents a hydrogen atom.

The hydroxy substituent of the phenyl group shown is preferably located para to the linkage of the phenyl group to the polymer backbone.

$R_3$ preferably represents a hydrogen atom or a $C_{1-14}$ alkyl group, especially a methyl group. Most preferably $R_3$ represents a hydrogen atom.

$R_4$ preferably represents a $C_{1-6}$ alkyl or $C_{1-6}$ hydroxyalkyl group. When it represents a hydroxyalkyl group the hydroxy group is preferably carried by the terminal carbon atom of the alkyl group. Examples of suitable groups $R_4$ are $—CH_3$, $—CH_2CH_2OH$, and $—CH_2CH_2CH_2CH_3$.

Preferably the ratio n/m is in the range 10/1 to 1/10, preferably 5/1 to 1/2. More preferably the ratio n/m is in the range 2/1 to 2/3. Most preferably the ratio n/m is in the range 3/2 to 2/3, especially 1/1.

The weight average molecular weight Mw of the polyhydroxystyrene polymer drawn above, as measured by gel permeation chromatography, is preferably in the range 5,000–75,000, especially 7,000–50,000. The number average molecular weight Mn of the polymer is preferably in the range 2,000–20,000, especially 3,000–8,000.

Suitably the hydroxyl group-containing polymer which does not itself comprise a pendant or backbone heat-labile moiety is present in an amount of at least 50% wt of the total weight of the composition, preferably at least 60% wt, most preferably at least 70% wt.

Suitably the hydroxyl group-containing polymer which does not itself comprise a pendant or backbone heat-labile moiety is present in an amount of no more that 99% wt of the total weight of the composition, preferably no more than 97% wt and more preferably no more than 95% wt.

Thus a preferred range of the amount of the hydroxyl group-containing polymer is 70–95% wt of the total weight of the composition.

When the hydroxyl group-containing polymer comprises a pendent or backbone heat-labile moiety, suitably the hydroxyl group-containing polymer is present in an amount of at least 80% wt of the total weight of the composition, preferably at least 85% wt, more preferably 90% wt.

When the hydroxyl group-containing polymer comprises a pendant or backbone heat-labile moiety, suitably the hydroxyl group-containing polymer is present in an amount of no more than 99% wt, preferably no more than 97% wt and more preferably no more than 95% wt of the total weight of the composition.

Thus a preferred range of the amount of hydroxyl group-containing polymer comprising a pendent or backbone heat-labile moiety is 90 to 95% wt of the total weight of the composition.

There may be more than one hydroxyl group-containing polymer in the heat-sensitive composition and reference to the amount of the hydroxyl group-containing polymer is to the total weight of all of the hydroxyl group-containing polymers present in the heat sensitive composition.

Preferred hydroxyl group-containing polymers having pendent heat-labile groups include polymers having the following units:

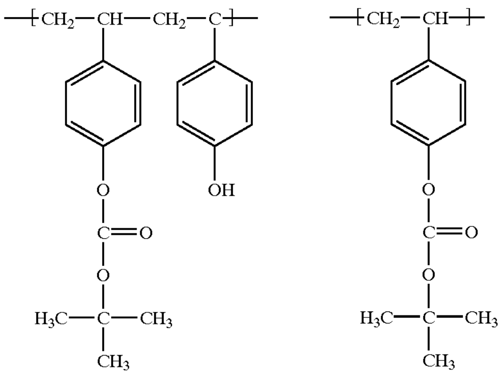

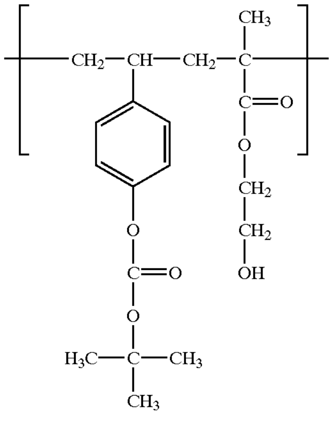

Suitably the positive working composition further comprises a compound capable of absorbing radiation and converting it to heat.

The coating may comprise at least two layers and the radiation absorbing compound may be provided in a separate layer to the hydroxyl group-containing polymer and heat-labile moiety.

In one embodiment of the invention the radiation absorbing compound may be provided in an underlayer of the coating and the hydroxyl group-containing polymer and the heat-labile moiety are provided in an overlayer of the coating, the underlayer being applied to the substrate first, and the overlayer being applied on top of the underlayer.

A large number of compounds, or combinations thereof, can be utilised as radiation absorbing compounds in the present invention.

In preferred embodiments the radiation absorbing compound absorbs infra-red radiation, for example 1065 nm radiation from a Nd-YAG laser. However, other materials which absorb other wavelength radiation e.g. 488 nm radiation from an Ar-ion laser source, may be used with the radiation being converted to heat by the radiation absorbing compound.

The radiation absorbing compound may usefully be a pigment, which is a black body or broad band absorber. Preferably, the pigment is able to efficiently absorb electromagnetic radiation and convert it to heat over a range of wavelengths exceeding 200 nm. Preferably exceeding 400 nm. Generally they are not decomposed by the radiation. Suitable pigments include carbon black, lamp black, channel black, furnace black, iron blue, insoluble azo pigments, azo lake pigments, condensed azo pigments, chelate azo pigments, phthalocyanine based pigments, anthraquinone based pigments, perylene or perynone based pigments, thioindigo based pigments, quinacridone based pigments, dioxazine based pigments, vat dyeing lake pigments, azine pigments, nitroso pigments, nitro pigments.

Especially preferred pigments are carbon black, lamp black, channel black, furnace black and iron blue.

Alternatively the radiation absorbing compound may be a dye. Dyes are generally narrow band absorbers typically able efficiently to absorb electromagnetic radiation and convert it to heat only over a range of wavelengths typically not exceeding 100 nm, and so have to be selected having regard to the wavelength of the radiation which is to be used for imaging. Suitable dyes include squarylium based dyes, merocyanine based dyes, cyanine based dyes, indolizine based dyes, pyrylium based dyes and metal dithioline based dyes.

Examples of suitable dyes include:

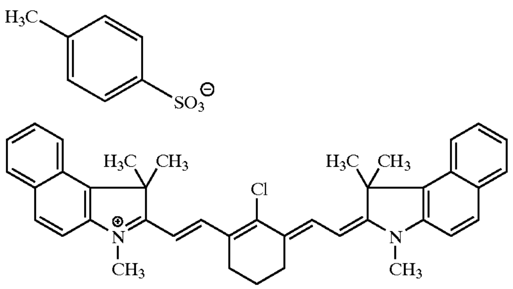

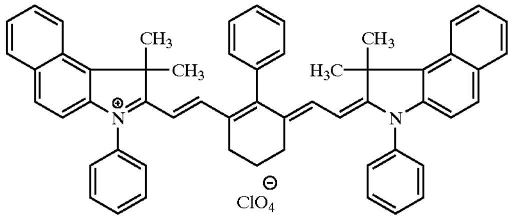

-continued

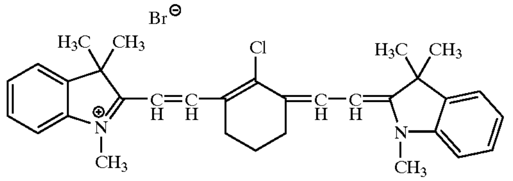

Suitably the radiation absorbing compound constitutes at least 0.25%, preferably at least 0.5%, more preferably at least 1.1%, most preferably at least 2% of the total weight of the composition. Suitably the radiation absorbing compound constitutes up to 25%, preferably up to 20%, more preferably up to 15% and most preferably up to 10% of the total weight of the composition. More specifically, the range is preferably 0.25–15% of the total weight of the composition, more preferably 0.5–10%. In all cases the figures given are as a percentage of the total weight of the dried composition.

There may be more than one radiation absorbing compound. References herein to the proportion of such compound(s) are to their total content.

Some radiation absorbing compounds may also function as compounds which act to reduce the developer solubility of the hydroxyl group-containing polymer as compared to when the radiation absorbing compound is not present in the composition.

The imagable article may comprise a precursor to a lithographic printing form, a precursor to a mask, or a precursor to an electronic part, especially a precursor to a printed circuit board (PCB).

Alternatively the imagable article may be a precursor to a letterpress printing form, or a decorative article. By decorative article we mean an article which is selectively etched to leave recesses in the surface of the article, which recesses may then be inlaid with decorative materials such as coloured resins. An example of a decorative article is a damascene.

The substrate of the imagable article may be constructed of any suitable material including metals, plastics materials, alloys, paper and polymeric materials.

When the imagable article of the invention in a precursor for a lithographic printing form the substrate may comprise a metal surface. Preferred metals include aluminium, zinc and titanium, or alloys thereof. Other alloys that may be useful include brass and steel. The substrate may be an aluminium plate which has undergone the usual anodic graining and post-anodic treatments well known in the lithographic art for enabling a heat-sensitive coating to be applied thereon. Another substrate which may be used in the present invention where the imagable article is a precursor for a lithographic printing form, is a plastics material base or treated paper base as used in the photography industry. A particularly useful plastics material base is polyethylene terephthalate which has been subbed to render its surface hydrophilic. Also a so-called coated paper which has been corona discharge treated can be used.

When the imagable article is a precursor to a letterpress printing form the substrate of the letterpress printing form precursor is suitably a metal surface or an alloy surface. The metal substrate may be a magnesium surface, a copper surface, or a zinc surface. Suitable alloy substrates include steel surfaces or copper alloy surfaces.

The substrate of the letterpress printing form precursor may alternatively comprise a laminate of two or more metals and/or alloys, such as a laminate of copper on steel.

When the imagable article is a precursor to a decorative article, the substrate of the decorative article precursor is suitably a metal substrate, such as a magnesium, copper or zinc surface, an alloy surface, such as a steel or copper alloy substrate, or a laminate of two or more metals and/or alloys.

When the imagable article of the invention is a precursor for an electronic part, the substrate preferably comprises an insulating material such as an insulating plastics material. Suitable plastics materials include polyethylene terephthalate, epoxy resins, phenolic resins, polyamides, and cellulose triacetate. The plastics material may be reinforced by fibres, preferably glass fibres. Other suitable materials for use as substrates in a precursor to an electronic part include quartz and silicon.

The substrate of the electronic part precursor may be an insulator which is etched to reveal a conductive or semiconductor layer below. For example it may be silica which is etched to reveal silicon. Alternatively it may be a conductive surface on which a wiring pattern is to be formed, by etching the precursor to remove said conductive surface selectively. Preferably when the substrate is conductive it is a copper substrate or a substrate comprising a copper-rich alloy. Preferably conductive or semi-conductive substrates are supported by an insulating substrate. The insulating substrate is suitably a dimensionally stable plastics board, for example of epoxy resin reinforced by glass fibres. There may be a conductive substrate on one or both sides of the insulating substrate. Preferably the precursor to an electronic part has a metal-insulator-metal structure, especially a copper-insulator-copper structure.

The positive working composition may further comprise one or more colorant compounds or moieties.

Colorant compounds or moieties may be quaternized nitrogen-containing triarylmethane dyes, including Crystal Violet (CI basic violet 3), Victoria Blue and Ethyl Violet; quaternized heterocyclic compounds, including Monazoline C, Monazoline O, Monazoline CY and Monazoline T, all of which are manufactured by Mona Industries, quinolinium compounds, such as 1-ethyl-2-methyl quinolinium iodide and 1-ethyl-4-methyl quinolinium iodide, benzothiazolium iodide, and pyridinium compounds such as cetylpyridinium bromide, ethyl viologen dibromide and fluoropyridinium tetrafluoroborate.

Other compounds or moieties useful as colorants polymer include Methylene Blue (CI Basic blue 9), polymethine dyes, cyanine dyes, Acidic Orange (CI Solvent orange 15) and a dye having the cation

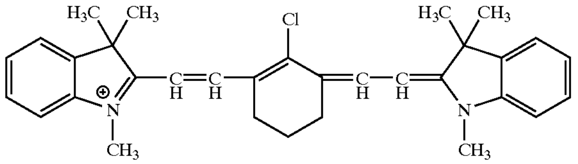

Useful quinolinium or benzothiazolium compounds are cationic cyanine dyes, such as Quinoldine Blue and 3-ethyl-2-[3-(3-ethyl-2-(3H)-benzothiazolyidene)-2-methyl-1-propenyl]benzothiazolium iodide, and the compound having a cation of formula

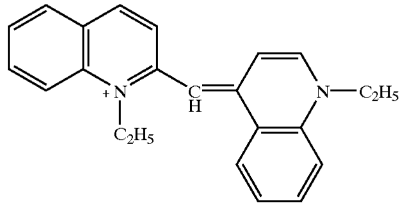

Suitably the colorant may include additional functional groups which act as infra-red absorbing groups.

Some colorants may also function as a compound which acts to reduce the developer solubility of the hydroxy group-containing polymer as compared to when the colorant is not present in the composition.

The compositions of the invention may contain other ingredients such as stabilizing additives and additional inert polymeric binders as are present in many positive working coatings.

According to a second aspect of the present invention there is provided a method of manufacturing a thermally imagable article of the first aspect of the invention, the method comprising the step of applying the composition as described herein, to a substrate.

Suitably the coating is dissolved in a solvent and applied to the substrate in liquid form. The solvent may then be removed by evaporation. Alternatively, the coating may be applied to a plastics film, the film bearing the coating then being heat laminated to the substrate.

Where the coating comprises more than one layer, the method may comprise applying an underlayer comprising the radiation absorbing compound to a substrate, and subsequently applying an overlayer comprising the hydroxyl group-containing polymer and heat-labile moiety on top of the underlayer. Preferably each layer of the coating is dissolved in a solvent and applied in liquid form, the solvent being subsequently removed by evaporation.

According to a third aspect of the invention there is provided a method of manufacturing an imaged article from the thermally imagable article of the invention as described herein, the method comprising the steps of:

a) exposing the coating as described herein imagewise; and b) removing the non-exposed regions of the coating, using a developer liquid.

The imaging of selected areas is preferably effected by the use of infra-red electromagnetic radiation, the coating comprising an infra-red absorbing compound as defined above. By infra-red radiation we mean electromagnetic radiation having a wavelength substantially between 600 nm and 1400 nm.

In preferred methods the electromagnetic radiation employed for exposure is of wavelength at least 600 nm, preferably at least 700 nm and more preferably at least 750 nm. Most preferably it is at least 800 nm. Suitably the radiation is of wavelength not more than 1400 nm, preferably not more than 1300 nm, more preferably not more than 1200 nm and most preferably not more than 1150 nm. A preferred range of electromagnetic radiation employed for exposure is between 700 nm and 1200 nm.

The radiation may be delivered by a laser under digital control. Examples of lasers which can be used to expose coatings suitable for the method of the present invention include semiconductor diode lasers emitting between 600 nm and 1400 nm, especially between 700 nm and 1200 nm. One example is the Nd YAG laser used in the Barco Crescent 42/T thermal image setter which emits at 1064 nm and another is the diode laser used in the Creo Trendsetter thermal image setter, which emits at 830 nm, but any laser of sufficient imaging power and whose radiation is absorbed by the coating can be used.

Suitably imaging is effected using an imaging energy of no more than 600 $mJcm^{-2}$, preferably no more than 500 $mJcm^{-2}$, more preferably no more than 400 $Jcm^{-2}$. Preferably imaging is effected using an imaging energy of at least 500 $mJcm^{-2}$, more preferably at least 75 $mJcm^{-2}$, and most preferably at least 100 $mJcm^{-2}$.

Thus a preferred range of imaging energy is 100–400 $Jcm^{-2}$

Suitably the developer liquid is an aqueous alkaline developer.

The method may further comprises the step of (c) contacting the image-wise exposed article with an etchant, in order to selectively etch regions of the substrate of the imagable article in which the coating was removed on development in step (b).

Suitably the imagable article is immersed in an etchant liquid. Alternatively the imagable article may be passed through a spray comprising an etchant liquid.

The etchant liquid is selected having regard to the substrate to be etched. For a substrate comprising metallic material, the etchant liquid preferably comprises a solution of ferric chloride, cupric chloride or ammonium persulfate. Particularly preferred etchant liquids are solutions of ferric chloride or cupric chloride, and hydrochloric acid, in water.

The method advantageously further comprises the step of removing the remaining regions of the coating after etching.

The remaining regions of the coating may be removed by contacting the precursor with a stripper liquid, for example an organic solvent such as acetone, or a strong alkali, for example sodium hydroxide or an alkali metal hydroxide.

In accordance with a fourth aspect of the present invention there is provided an article comprising a substrate bearing an image thereon, produced by the method of the third aspect. The article may be a lithographic printing form, a mask, a letterpress printing form, a decorative article or an electronic part, especially a printing circuit board (PCB).

According to a fifth aspect of the present invention there is provided a positive working, heat-sensitive composition comprising a hydroxyl group-containing polymer and a heat-labile moiety which decreases the developer solubility of the composition as compared to the developer solubility of the composition without the heat-labile moiety, and wherein the composition further comprises a compound capable of absorbing radiation and converting it to heat.

The hydroxyl group-containing polymer, heat-labile moiety and compound capable of absorbing radiation and converting it to heat are preferably as described hereinabove.

Preferably the radiation absorbing compound is a infrared radiation absorbing compound.

The positive-working heat-sensitive composition may further comprise a colorant compound, the colorant compound being preferably as described hereinabove.

The positive-working heat-sensitive composition may further comprise other ingredients such as stabilizing additives and additional inert polymeric binders as are present in many positive working compositions.

Preferably the positive-working heat-sensitive composition does not comprise a compound capable of generating an acid on heating. Suitably the positive-working heat-sensitive composition does not comprise a compound capable of generating an acid upon exposure to radiation.

According to a sixth aspect of the present invention there is provided a thermally imagable article comprising a substrate on which is coated the positive working, heat-sensitive composition of the fifth aspect.

Preferably, the imagable article and substrate are as described hereinabove.

According to a seventh aspect of the present invention there is provided a method of manufacturing the thermally imagable article of the sixth aspect, comprising coating the positive-working heat-sensitive composition of the fifth aspect of the invention to a substrate.

Preferably the method is as described hereinabove.

According to an eighth aspect of the present invention, there is provided a method of manufacturing an imaged article from the thermally imagable article of the sixth aspect of the invention, the method comprising the steps of:

(a) exposing the coating as described herein imagewise; and (b) removing the non-exposed regions of the coating using a developer liquid.

According to an ninth aspect of the present invention, there is provided an imaged article produced by the method of the eighth aspect of the invention.

The following examples are more particularly seen to illustrate the various aspects of the present invention described hereinabove.

EXAMPLES

The following are referred to hereinafter:

IR Dye A: having the following structure:

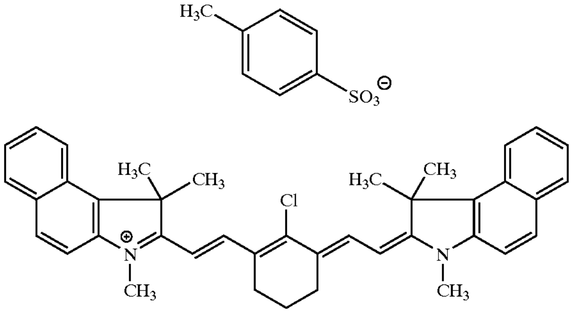

Crystal violet (basic violet 3, C.I. 42555, Gentian Violet) supplied by Aldrich Chemical Company, Dorset, UK having the structure:

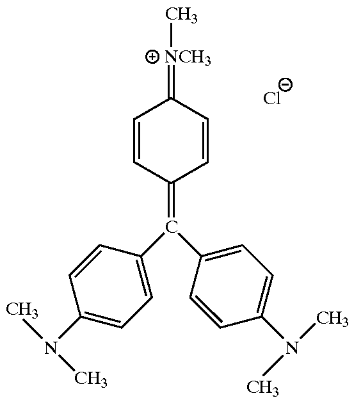

LB6564, a 1:1 phenol cresol novolac resin supplied by Bakelite, UK.

Borden PD 126, a cresol novolac resin as supplied by Borden Ltd, Southampton, UK.

Resin A—Lyncur CBA (PVP-butylacrylate), a copolymer of p-vinylphenol supplied by Siber Hegner Ltd, Beckenham, UK, and having the structure:

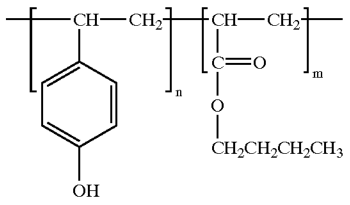

*n/m*=8/2–6/4, *Mw*=10 000–30 000*Mn*=5000–5500

Resin B—Lyncur M(S-4), a polyvinylphenol polymer supplied by Siber Hegner.

Inhibitor 1—t-butyl N-(benzyloxy)carbamate as supplied by Aldrich, having the structure:

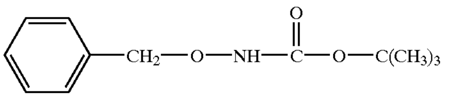

Inhibitor 2—t-butyl N-(t-butoxycarbonyloxy)carbamate as supplied by Aldrich, having the structure:

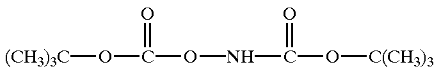

Inhibitor 3—di-t-butyl dicarbonate as supplied by Aldrich, having the structure:

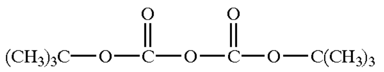

Developer A: a solution composed of 0.6% NaOH and 0.5% Surfactant Mix (by weight).

Developer B: a solution composed of 1.0% NaOH and 0.5% Surfactant Mix (by weight).

Developer C: a solution composed of 3.5% NaOH and 0.5% Surfactant Mix (by weight).

Developer D: a solution composed of 2.5% NaOH and 0.5% Surfactant Mix (by weight).

Developer E: a solution composed of 1.2% NaOH and 0.5% Surfactant Mix (by weight).

Surfactant Mix: a mix of Triton CF32 as supplied by Rohm and Haas (UK) Ltd, Croydon, UK (0.7%), Triton H66 as supplied by Rohm and Haas (91.9%) and Synperonic T/304 as supplied by ICI Surfactants, Middlesborough, UK (7.4%).

Copper substrate: Double sided copper laminate of overall thickness 254 μm, having copper cladding 18 μm thick on each side of an insulating substrate, catalogue number N4105-2, as supplied by New England Laminates (UK) Ltd of Skelmersdale, UK. The substrate was treated to remove tarnish by washing with water, rinsing with 2% solution of citric acid for 30 seconds, washing again with distilled water, and drying for 60 seconds at 90° C.

Creo Trendsetter (trade mark0 3244—a commercially available platesetter, using Pro corn Plus software, operating at a wavelength of 830 nm at a power if 6.5 W and supplied by Creo Products Inc. of Burnaby, Canada.

Coatings were dried using a Mathis Labdryer oven as supplied by Werner Mathias AG, Zurich, Switzerland.

Etching solution A: a cupric chloride, hydrochloric acid etch made up in the following ratios (by volume):

$CuCl_2$: HCl:Water of 6:4:10. The anhydrous $CuCl_2$ can be obtained from William Blyth of Oswaldtwistle, UK.

Stripper A: acetone as supplied by Aldrich.

Metallised polyester: MET506 as supplied by HiFi Industrial Film Ltd, Hertfordshire, UK.

a Synthesis b Synthesis of poly(vinylphenol)

POLYMER I

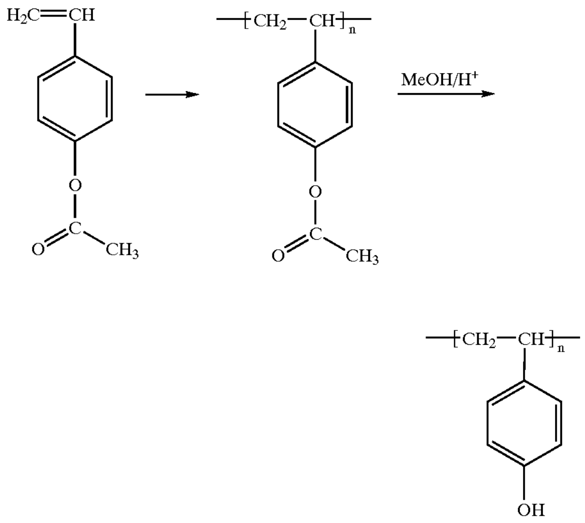

1. 4-acetoxystyrene (30.0 g) was dissolved in THF (90 g) and then purged for 10 min with nitrogen in the reaction vessel
2. Benzoyl peroxide (0.3 g) was added and the reaction mixture refluxed for 5 hours).
3. After this time, methanol (55 g) and hydrochloric acid (0.33 g) was added and refluxed for 2 hours.
4. The reaction was monitored using FT-IR and step 3 repeated until the complete removal of the acetyl groups was observed.
5. The polymer (Polymer I) was isolated by dissolving in Dowanol PM and precipitating in water, followed by drying in vacuo at 40° C.

Partial Functionalisation of Poly(vinylphenol) with Tert-butyl Oxycarbonyl ("tBOC") Groups

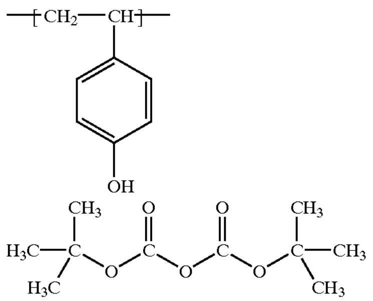

$K_2CO_3$
18-crown-6

-continued

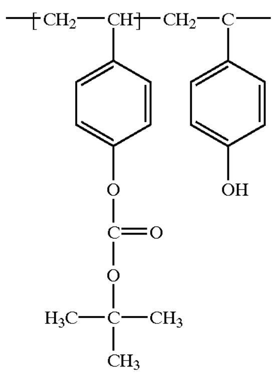

POLYMER II

Partial Functionalisation of poly(vinyl phenol) with 5% t-BOC

1. Poly(vinylphenol)(9.0 g 0.075 moles) was dissolved in THF (27 g).
2. Di-t-butyldicarbonate (0.8175 g, 75x$10^{-3}$ moles) and 18-crown-6 (0.25 g) were added to the solution.
3. The reaction mixture was stirred for 2 hours and then the product (Polymer II) was isolated by precipitation from Dowanol PM in water.

Partial Functionalisation of poly(vinyl phenol) with 20% tBOC

1. Poly(vinylphenol)(9.0 g 0.075 moles) was dissolved in THF (27 g).
2. Di-t-butyldicarbonate (3.75 g. 75x0.015 moles), potassium carbonate (2.07 g 0.015 moles) and 18-crown-6 (0.25 g) were added to the solution.
3. The reaction mixture was stirred for 2 hours and then the product (Polymer III) was isolated by precipitation from Dowanol PM in water.

Synthesis of Poly(vinylphenol-co-2 Hydroxyethyl Methacrylate):

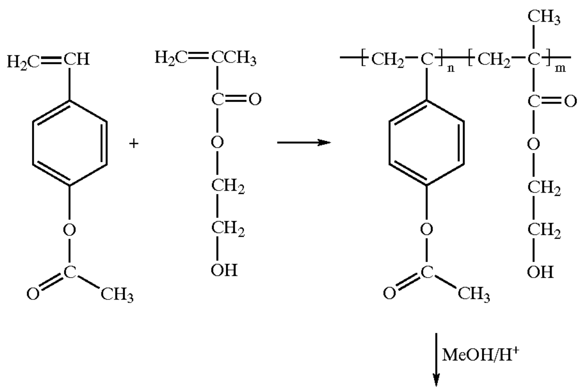

-continued

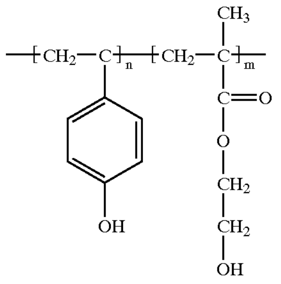

POLYMER IV 4-acetoxystyrene (35.0 g) and 2-hydroxyethylmethacrylate 8.424 g,) were dissolved in THF (100 g) and then purged for 10 min with nitrogen in the reaction wheel.

Benzoyl peroxide (0.434 g) was added and the reaction mixture refluxed for 5 hours.

After this time, methanol (55 g) and hydrochloric acid (0.33 g) were added and the reaction mixture was refluxed for 2 hours.

The reaction was monitored using FT-IR and completed when the complete removal of the acetyl groups was observed.

The polymer (Polymer IV) was isolated by dissolving in Dowanol PM and precipitating in water, followed by drying in vacuo at 40° C.

Partial Functionalisation of Poly(vinylphenol-co-2 Hyroxyethyl Methacrvlate) [PVP-co-HEMA] with Tert-butyl Oxycarbonyl Group (tBOC)

Partial Functionalisation of PVP-CO-HEMA with 5% tBOC

1. PVP-co-HEMA (10.0 g, 0.0815 moles) was dissolved in THF (25 g).
2. Di-t-butyldicarbonate (0.89 g, $4.075\times10^{-3}$ moles), potassium carbonate (0.562 g, $4.0755\times10^{-3}$ moles)and 18-crown-6 (0.25 g) were added to the solution.
3. The reaction mixture was stirred for 2 hours and then the product (Polymer V) was isolated by precipitation from Dowanol PM in water.

Partial Functionalisation of PVP-CO-HEMA with 20% tBOC

1. PVP-co-HEMA (10.0 g, 0.0815 moles) was dissolved in THF (25 g).
2. Di-t-butyldicarbonate (3.56 g, 0.0163 moles), potassium carbonate (0.562 g, 0.0163 moles) and 18-crown-6 (0.25 g) were added to the solution.
3. The reaction mixture was stirred for 2 hours and then the product (Polymer VI) was isolated by precipitation from Dowanol PM in water.

Partial Functionalisation of a Novolac Resin with Tert-butyl Oxycarbonyl Groups (tBOC)

Partial Functionalisation of novolac with 5% tBOC

1. LB6564 (novolac resin, hereinafter called (Polymer VII) (14.13 g, 0.125 moles) was dissolved in THF (75 g).
2. Di-t-butyldicarbonate (1.363 g, $6.25\times10^{-3}$ moles), potassium carbonate (0.862 g, $6.25\times10^{-3}$ moles) and 18-crown-6 (0.5 g) were added to the solution.
3. The reaction mixture was stirred for 2 hours and then the product (Polymer VII) was isolated by precipitation from Dowanol PM in water.

Partial Functionalisation of a Cresol Novolac Resin with Tert-butyl Oxycarbonyl Groups (tBOC)

Partial Functionalisation of cresol novolac with 5% tBOC

1. Borden PD 126 (cresol novolac resin, hereinafter called (Polymer IX) (14.13 g, 0.125 moles) was dissolved in THF (75 g).
2. Di-t-butyldicarbonate (0.862 g, $6.25\times10^{-3}$ moles), potassium carbonate (0.862 g, $6.25\times10^{-3}$ moles) and 18-crown-6 (0.5 g) were added to the solution.
3. The reaction mixture was stirred for 2 hours and then the product (Polymer X) was isolated by precipitation from Dowanol PM in water.

Partial Functionalisation of cresol novolac with 20% tBOC

1. Polymer IX (14.13 g, 0.125 moles) was dissolved in THF (75 g).
2. Di-t-butyldicarbonate (5.45 g, 0.025 moles), potassium carbonate (3.45, 0.025 moles) and 18-crown-6 (0.25 g) were added to the solution.
3. The reaction mixture was stirred for 2 hours and then the product (Polymer IX) was isolated by precipitation from Dowanol PM in water.

Synthesis of Poly(t-butoxycarbonyloxystyrene)

POLYMER X

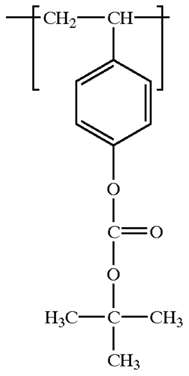

1. Tert-butoxycarbonyloxystyrene (12.0 g) was dissolved in THF (50 g) and then purged for 10 min with nitrogen in the reaction vessel.
2. Benzoyl peroxide (0.12 g) was added and the reaction mixture refluxed for 3.5 hours.
3. After cooling, the reaction mixture was poured into water (2.5 l) and the precipitate agitated by shear mixing. The poly(t-butoxycarbonyloxystyrene) Polymer X, was filtered and dried in vacuo at 40° C.

Synthesis of Poly(t-butoxycarbonyloxystyrene-co-3-hydroxyethylmethacrylate)

POLYMER XI

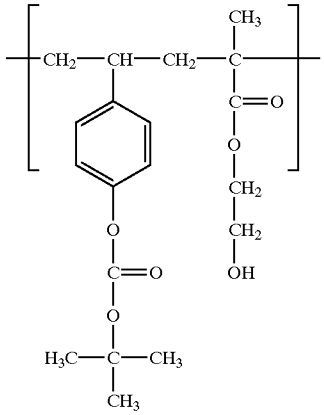

The procedure used in the synthesis of poly(t-butoxycarbonyloxystyrene) was repeated here, but using t-butoxycarbonyloxystyrene (12.0 g) and 2-hydroxyethylmethacrylate (1.77 g) with benzoyl peroxide (0.138 g).

Examples C1 to 11 (All comparative examples "C#" are polymers without the tBOC group)

Coatings were prepared as solutions in 1-methoxypropan-2-ol, as described in the table below. The coatings were applied to the copper substrate, using a Meyer bar, to give a dry film coat weight of 5 $gm^{-2}$. The coatings were dried at 110° C. for 150 s in the Mathis labdryer oven.

| | b Polymer | | | | | | | | | | | Cry-stal Vio-let | IR DYE A |
|---|---|---|---|---|---|---|---|---|---|---|---|---|---|
| | I | II | III | IV | V | VI | VII | VIII | IX | X | XI | | |
| | 91 | | | | | | | | | | | 1 | 8 |
| 2 | | 91 | | | | | | | | | | 1 | 8 |
| 3 | | | 91 | | | | | | | | | 1 | 8 |
| C4 | | | | 91 | | | | | | | | 1 | 8 |
| 5 | | | | | 91 | | | | | | | 1 | 8 |
| 6 | | | | | | 91 | | | | | | 1 | 8 |
| C7 | | | | | | | 91 | | | | | 1 | 8 |
| 8 | | | | | | | | 91 | | | | 1 | 8 |
| C9 | | | | | | | | | 91 | | | 1 | 8 |
| 10 | | | | | | | | | | 91 | | 1 | 8 |
| 11 | | | | | | | | | | | 91 | 1 | 8 |

After 24 hours, a sample of the printed circuit board precursor was imaged on The Trendsetter 3244, using the internal test pattern, plot O at energies of 200, 300 and 400 $mJcm^{-2}$. The precursor was then developed by immersion in the relevant developer (20° C.) solution as detailed below.

The time required to successfully develop away the coating in areas that had been completely struck by the laser is noted. The time taken to remove the non-imaged area is also recorded. A ratio of the two is then made. This ratio gives an indication of processability.

| | | Dissolution Ratio | | |
|---|---|---|---|---|
| Example | Developer | Imaged at 200 $mJcm^{-2}$ | Imaged at 200 $mJcm^{-2}$ | Imaged at 200 $mJcm^{-2}$ |
| C1 | A | 1:2.8 | 1:3.0 | 1:3.0 |
| 2 | A | 1:3.6 | 1:5.2 | 1:5.8 |
| 3 | A | 1:3.2 | 1:5.3 | 1:6.4 |
| C4 | B | 1:2.0 | 1:2.0 | 1:2.0 |
| 5 | B | 1:3.1 | 1:4.7 | 1:4.7 |
| 6 | B | 1:3.0 | 1:4.8 | 1:4.8 |
| C7 | C | Coating completely removed in 1 second | | |
| 8 | C | 1:4.9 | 1:5.7 | 1:5.7 |
| C9 | D | Coating completely removed in 1 second | | |
| 10 | D | 1:4.5 | 1:6.8 | 1:7.7 |
| 11 | D | 1:3.2 | 1:4.5 | 1:9.0 |

A sample precursor from example 2 was also etched—uncovered copper removed, (after imaging at 300 $mJcm^{-2}$, and developing in developer A at 20° C. for 30 sounds), by immersion in etching solution A, which was constantly being stirred for 1 minute at 40° C., using a spray processor (as supplied by PCB machinery Ltd of Haslingden, Lancashire, UK). The areas of the coating that had not been struck by the laser and had not dissolved away in the developer, completely resisted the etch process. The precursors were then rinsed in water.

Finally the precursors were cleaned by rinsing in stripper A (to remove the remaining coating) at 20° C. for 60 seconds. The printed circuit board precursor has copper patterns remaining that were accurate copies of the precursors above, after the development stages.

Examples C12 to 18

Coatings were prepared as solutions in 1-methoxypropan-2-ol, as described in the table below. The coatings were applied to the copper substrate, using a Meyer bar, to give a dry film coat weight of 5 $gm^{-2}$. The coatings were dried at 110° C. for 150 s in the Mathis labdryer oven.

| Example | Resin A | Resin B | IR dye A | Crystal Violet | Inhib-itor 1 | Inhib-itor 2 | Inhib-itor 3 |
|---|---|---|---|---|---|---|---|
| C12 | 50 | 40 | 9 | 1 | | | |
| 13 | 42 | 40 | 9 | 1 | 8 | | |
| 14 | 42 | 40 | 9 | 1 | | 8 | |
| 15 | 42 | 40 | 9 | 1 | | | 8 |
| 16 | 35 | 40 | 9 | 1 | 15 | | |
| 17 | 35 | 40 | 9 | 1 | | 15 | |
| 18 | 35 | 40 | 9 | 1 | | | 15 |

After 24 hours, a sample of the printed circuit board precursor was imaged on the Trendsetter 3244, using the internal test pattern, plot 0 at energies of 300 and 500 $mJcm^{-2}$. The precursor was then developed by immersion in developer E (20° C.) solution as detailed below.

The time required to successfully develop away the coating in areas that had been completely struck by the laser is noted. The time take to remove the non-imaged area is also recorded. A ratio of the two is then made. This ratio gives an indication of processability.

| | Dissolution Ratio | |
|---|---|---|
| Example | Imaged at 300 $mJcm^{-2}$ | Imaged at 500 $mJcm^{-2}$ |
| C12 | 1:2.5 | 1:3.4 |
| 13 | 1:2.8 | 1:3.7 |
| 14 | 1:3.5 | 1:4.6 |
| 15 | 1:2.8 | 1:4.1 |
| 16 | 1:2.7 | 1:3.9 |
| 17 | 1:2.9 | 1:3.8 |
| 18 | 1:2.6 | 1:3.6 |

Examples 19 and 20—Demonstration of Imaging Mechanism

Coatings were prepared as solutions in 1-methoxypropan-2-ol, as described in the table below. The applied to metallised polyester, using a Meyer bar, to give a fry film coat weight of 1.5 $gm^{-2}$. The coatings were dried at 110° C. for 90 s in the Mathis labdryer oven.

| Example | Polymer X | Polymer XI | |
|---|---|---|---|
| 19 | 94 | | 6 |
| 20 | | 94 | 6 |

After 24 hours, samples of examples 19 and 20 were imaged on the Trendsetter 3244, using the internal test pattern, plot 5 (blanket, 100% laser exposure) at energies of 300 and 500 $mJcm^{-2}$.

For example 19, FT-ir spectra were then obtained (using a Perkin Elmer system 2000 with grazing angle attachment as supplied by Perkin Elmer, Ill., USA) with the samples where the laser had completely struck the coating surface at 300 and 500 mJcm$^{-2}$ and of a sample which had been left, unexposed.

The process was repeated for example 20.

FIG. 1 illustrates the spectra obtained from example 19. Three traces can be seen, one from an unexposed example 19 sample, one for an example 19 sample that had been imaged at 300 mJcm$^{-2}$ and another that had been imaged at 500 mJcm$^{31}$ $^{2}$. The peak on the graph at 3400 cm$^{-2}$ is due to OH stretching. The peak at 1750 cm$^{-1}$ is due to the presence of the carbonyl group.

Figure 2:
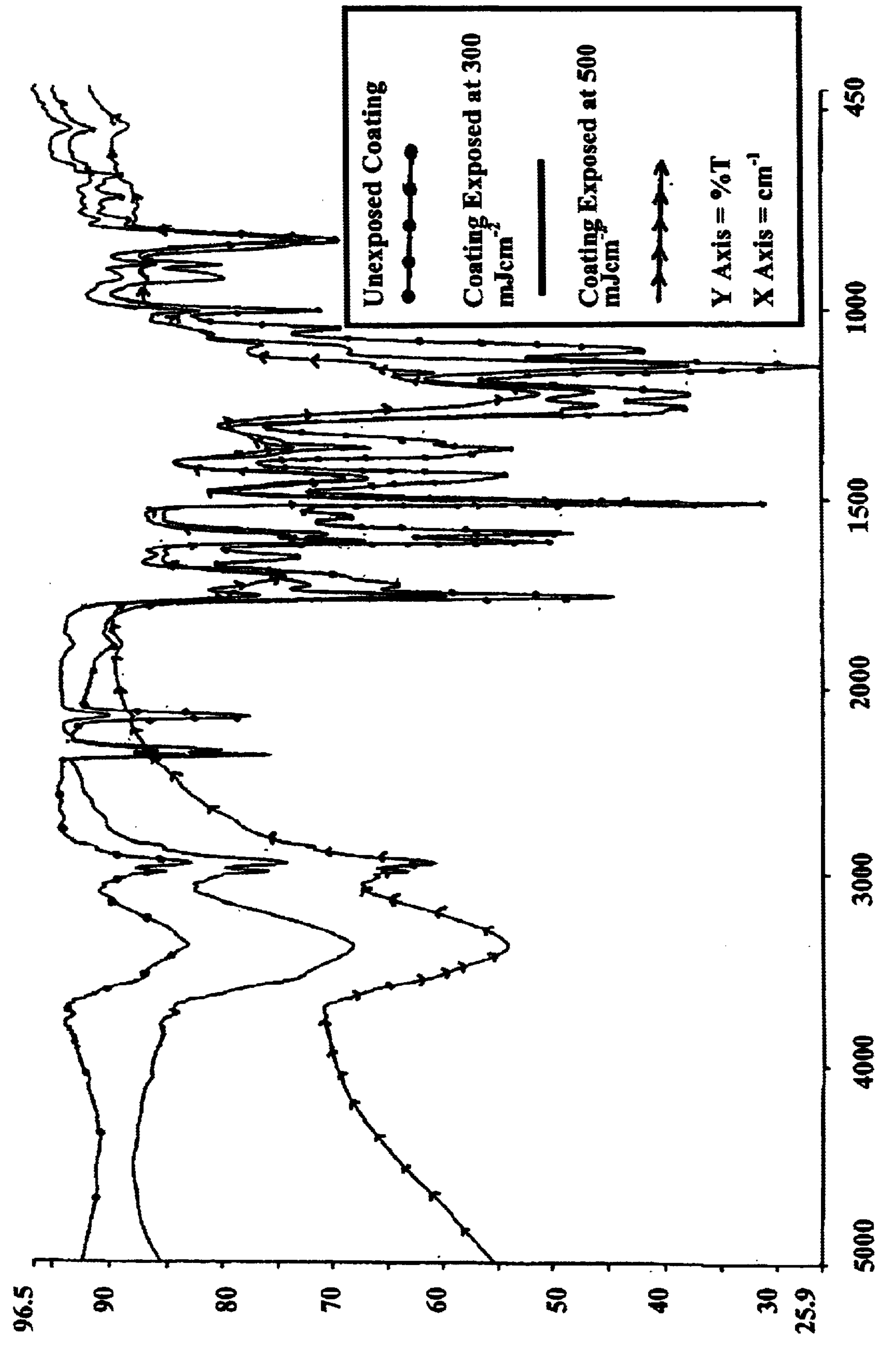
FIG. 2 illustrates the FTIR spectra obtained from the coating of Example 20.

FIG. 2 illustrates the spectra obtained from example 20. Three traces can be seen, one from an unexposed example 20 sample, one for an example 20 sample that had been imaged at 300 mJcm$^{-2}$ and another that had been imaged at 500 mJcm$^{-2}$. The peak on the graph at 3375 cm$^{-1}$ is due to OH stretching. The peak at 1750 cm$^{-1}$ is due to the presence of the carbonyl group.

One can see in both examples, that as each sample is imaged with increasing energy density, the OH peak increases and the C═O peak decreases. This is evidence that on imaging, the tert-butoxycarbonyl group is removed from polymer X (for example 19) and polymer XI (for example 20) and is replaced with an OH group, which is more alkali developer soluble.

The reader's attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extend to any novel one, or any novel combination, of the features disclosed in this specification (including any accompanying claims, abstract and drawings), or to any novel one, or any novel combination, of the steps of any method or process so disclosed.

The invention has been described in detail with particular reference to preferred embodiments thereof, but it will be understood that variations and modifications can be effected within the spirit and scope of protection.

The invention claimed is:

1. A thermally imagable article comprising a substrate and a coating of a positive working heat-sensitive composition comprising a polymer represented by the structure:

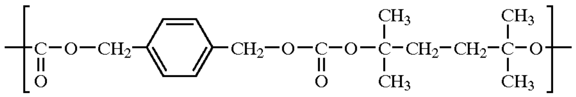

2. A thermally imagable article as claimed in claim 1, wherein the amount of the polymer is 70–95% wt of the total weight of the composition.

3. A thermally imagable article as claimed in claims 1 wherein the amount of the polymer is 90 to 95% wt of the total weight of the composition.

4. A thermally imagable article as claimed in claim 1, wherein the positive working composition further comprises a radiation absorbing compound capable of absorbing radiation and converting it to heat.

5. A thermally imagable article as claimed in claim 4, wherein the radiation absorbing compound is an infrared radiation absorbing compound.

6. A thermally imagable article as claimed in claim 4 wherein the radiation absorbing compound constitutes between 0.5–10% wt of the total weight of the composition.

7. A thermally imagable article as claimed in claim 1, wherein the imagable article is a precursor to a lithographic printing form, a precursor to a mask, or a precursor to an electronic part.

8. A thermally imagable article as claimed in claim 1, wherein the positive working composition further comprises one or more colorant compounds or moieties.

9. A method of manufacturing a thermally imagable article of claim 1, the method comprising the step of applying the positive working heat-sensitive composition to a the substrate.

10. A method of manufacturing an imaged article from the imagable article of claim 1, the method comprising the steps of:

a) exposing the coating imagewise; and b) removing non-exposed regions of the coating, using a developer liquid.

11. A method as claimed in claim 10, wherein the coating comprises an infra-red absorbing compound and the exposing step comprises imagewise exposing the coating to infra-red electromagnetic radiation.

12. A method as claimed in claim 10, wherein the developer liquid is an aqueous alkaline developer.

13. A method as claimed in claim 10, wherein the removing step further comprises removing non-exposed regions of the coating to reveal regions of the substrate. and the method further comprises the steps of (c) contacting the image-wise exposed article with an etchant, in order to selectively etch the revealed regions of the substrate.

14. An article comprising a substrate bearing an image thereon, produced by the method of claim 10.

15. A positive working, heat-sensitive composition comprising a polymer having the formula:

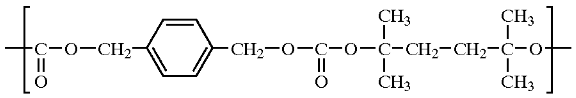

and a radiation absorbing compound capable of absorbing radiation and converting it to heat.

16. A positive working, heat-sensitive composition as claimed in claim 15, wherein the radiation absorbing compound is a infra-red radiation absorbing compound.

17. A positive-working heat-sensitive composition as claimed in claim 15, wherein the composition further comprises one or more colorant compounds or moieties.

18. A positive-working heat-sensitive composition as claimed in claim 15, wherein the composition does not comprise a compound capable of generating an acid on exposure to heat.

19. A positive-working heat-sensitive composition as claimed in claim 15, wherein the composition does not comprise a compound capable of generating an acid upon exposure to radiation.

20. A thermally imagable article comprising a substrate on which is coated the positive working, heat-sensitive composition of claim 15.

21. A method of manufacturing the imagable article of claim 20, the method comprising the step of coating the positive working, heat-sensitive composition to a substrate.

22. A method of manufacturing the imaged article from the imagable article of claim 20, the method comprising the steps of:

(a) exposing the coating imagewise; and (b) removing the non-exposed regions of the coating using a developer liquid.

23. An imaged article produced by the method of claim 22.

* * * * *

UNITED STATES PATENT AND TRADEMARK OFFICE

CERTIFICATE OF CORRECTION

PATENT NO. : 6,673,514 B2 
DATED : January 6, 2004
INVENTOR(S) : Anthony Paul Kitson et al.

It is certified that error appears in the above-identified patent and that said Letters Patent is hereby corrected as shown below:

Column 7,
Line 45, before the third formula, insert -- or --.

Column 11,
Line 60, delete "400 Jcm-$^{2}$" and insert therefor -- 400 mJcm-$^{2}$ --
Line 65, delete "Jcm-$^{2}$" and insert therefor -- mJcm-$^{2}$ --

Column 19,
Line 57, delete "sounds" and insert therefor -- seconds --

Column 20,
Line 52, after "The" and before "applied" insert -- coatings were --
Line 53, delete "fry" anmd insert therefor -- dry --

Column 21,
Line 13, delete "mJcm-$^{31\ 2}$" and insert therefor -- mJcm-$^{2}$ --

Column 22,
Line 33, delete "a"

Signed and Sealed this

Eleventh Day of May, 2004

JON W. DUDAS
*Acting Director of the United States Patent and Trademark Office*